US010855184B2

(12) United States Patent
Menezes et al.

(10) Patent No.: US 10,855,184 B2
(45) Date of Patent: Dec. 1, 2020

(54) LOAD CURRENT MEASUREMENT

(71) Applicant: TEXAS INSTRUMENTS INCORPORATED, Dallas, TX (US)

(72) Inventors: Vinod Joseph Menezes, Bengaluru (IN); Manikandan Rr, Bengaluru (IN); Rajat Chauhan, Bengaluru (IN); Vipul Kumar Singhal, Bengaluru (IN); Mahesh Madhukar Mehendale, Dallas, TX (US); Kaichien Tsai, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/601,143

(22) Filed: Oct. 14, 2019

(65) Prior Publication Data
US 2020/0204075 A1 Jun. 25, 2020

Related U.S. Application Data

(63) Continuation of application No. 16/227,314, filed on Dec. 20, 2018, now Pat. No. 10,447,142.

(51) Int. Cl.
*G05F 3/24* (2006.01)
*G05F 1/573* (2006.01)
(Continued)

(52) U.S. Cl.
CPC .... *H02M 3/1582* (2013.01); *G01R 19/16538* (2013.01); *G05F 1/462* (2013.01);
(Continued)

(58) Field of Classification Search
CPC .......... G05F 1/462; G05F 1/573; G05F 1/575; G05F 3/247; H02M 2001/0009
(Continued)

(56) References Cited

U.S. PATENT DOCUMENTS 7,309,975 B2 * 12/2007 Fishbein ............. H02M 3/1582
323/259
8,773,097 B2 * 7/2014 Franklin ............... H02M 3/157
323/283

(Continued)

OTHER PUBLICATIONS

Dutta, Prabal, et al. "Energy Metering for Free: Augmenting Switching Regulators for Real-Time Monitoring." IPSN'2008, ISLPED'2008.
(Continued)

*Primary Examiner* — Gary A Nash
(74) *Attorney, Agent, or Firm* — Michael A. Davis, Jr.; Charles A. Brill; Frank D. Cimino

(57) ABSTRACT

A switch-mode power supply includes a DC-DC converter and metering circuitry that is coupled to the DC-DC converter. The metering circuitry includes scaling circuitry, a current source, a capacitor, switching circuitry, and a comparator. The scaling circuitry is configured to generate a reference current scaled to be a predetermined fraction of a peak current flowing in an inductor of the DC-DC converter. The current source is configured to output a first current that is one-half of the reference current. The capacitor is coupled to the current source. The switching circuitry is configured to switchably connect the current source to the capacitor. The comparator is coupled to the capacitor. The comparator is configured to generate a signal indicating that a voltage across the capacitor exceeds a threshold voltage.

23 Claims, 4 Drawing Sheets

(51) Int. Cl.
*G05F 1/46* (2006.01)
*H02M 3/158* (2006.01)
*G01R 19/165* (2006.01)
*H02M 1/00* (2006.01)
*G05F 1/575* (2006.01)

(52) U.S. Cl.
CPC .............. *G05F 1/573* (2013.01); *G05F 1/575* (2013.01); *G05F 3/247* (2013.01); *H02M 2001/0009* (2013.01)

(58) Field of Classification Search
USPC ........ 323/271, 274, 277, 284, 285, 288, 290
See application file for complete search history.

(56) References Cited

U.S. PATENT DOCUMENTS

| | | | | |
|---|---|---|---|---|
| 9,024,600 | B2* | 5/2015 | Wiktor | H02M 3/156 323/272 |
| 2009/0146620 | A1* | 6/2009 | Ng | G01R 19/0092 323/222 |
| 2010/0052632 | A1* | 3/2010 | Wu | H02M 3/156 323/272 |
| 2011/0221416 | A1* | 9/2011 | Ivanov | G05F 1/67 323/285 |
| 2013/0069609 | A1* | 3/2013 | Chang | G05F 1/46 323/282 |
| 2014/0347078 | A1* | 11/2014 | Qin | G01R 19/0092 324/713 |
| 2015/0280544 | A1* | 10/2015 | Wang | H02M 1/32 323/285 |
| 2016/0190926 | A1* | 6/2016 | Ni | G05F 1/56 323/271 |
| 2017/0040895 | A1* | 2/2017 | May | G01R 19/165 |

OTHER PUBLICATIONS

Ramadass, Yogesh K. and Anantha P. Chandrakasan. "Minimum Energy Tracking Loop With Embedded DC-DC Converter Enabling Ultra-Low-Voltage Operation Down to 250 mV in 65 nm CMOS" IEEE Journal of Solid-State Circuits, vol. 43, No. 1, Jan. 2008. pp. 256-265.

Sinangil, Yildiz, et al. "A Self-Aware Processor SoC Using Energy Monitors Integrated Into Power Converters for Self-Adaptation." 2014 Symposium of VLSI Circuits Digest of Technical Papers.

Sinangil, Yildiz and Anantha P. Chandrakasan. "A 128 Kbit SRAM With an Embedded Energy Monitoring Circuit and Sense-Amplifier Offset Compensation Using Body Biasing." EEE Journal of Solid-State Circuits, vol. 49, No. 11, Nov. 2014. pp. 2730-2739.

* cited by examiner

US 10,855,184 B2

LOAD CURRENT MEASUREMENT

CROSS-REFERENCE TO RELATED APPLICATION

This application is a continuation of U.S. patent application Ser. No. 16/227,314 filed Dec. 20, 2018, which is incorporated herein by reference.

BACKGROUND

Measurements of the energy consumed by a circuit are valuable for a variety of reasons. For example, software developers can use energy consumption measurements to optimize the programs they produce for minimum energy consumption. Similarly, hardware systems can apply energy compensation measurements to adjust operation to accommodate a limited energy supply or to optimize energy utilization.

SUMMARY

In one example of circuitry for measuring current consumed by a load circuit, a switch-mode power supply includes a DC-DC converter and metering circuitry that is coupled to the DC-DC converter. The metering circuitry includes scaling circuitry, a current source, a capacitor, switching circuitry, and a comparator. The scaling circuitry is configured to generate a reference current scaled to be a predetermined fraction of a peak current flowing in an inductor of the DC-DC converter. The current source is configured to output a current that is one-half of the reference current. The capacitor is coupled to the current source. The switching circuitry is configured to switchably connect the current source to the capacitor. The comparator is coupled to the capacitor. The comparator is configured to generate a signal indicating that a voltage across the capacitor exceeds a threshold voltage.

In another example, a load current metering circuit includes scaling circuitry, a current source, a capacitor, switching circuitry, and a comparator. The scaling circuitry is configured to generate a reference current scaled to be a predetermined fraction of a peak current flowing in an inductor of a DC-DC converter. The current source is configured to output a current that is one-half of the reference current. The capacitor is coupled to the current source. The switching circuitry is coupled to the capacitor. The switching circuitry is configured to control flow of current from the current source to the capacitor. The comparator is coupled to the capacitor. The comparator is configured to generate a signal indicating that a voltage across the capacitor exceeds a threshold voltage.

In a further example, a load current metering circuit includes a current mirror, a first current source, a second current source, switching circuitry, a capacitor, and a comparator. The current mirror is configured to produce a reference current that is a predetermined fraction of a peak current flowing in an inductor of a DC-DC converter. The first current source is configured to output a first current that is one-half of the reference current. The second current source is configured to output a second current that is one-half of the reference current. The switching circuitry is coupled to the first current source and the second current source. The switching circuitry is configured to switchably control the first current and the second current. The capacitor is coupled to the switching circuitry. The capacitor is configured to be charged by the first current and the second current. The comparator is coupled to the capacitor. The comparator is configured to generate a signal indicating that a voltage across the capacitor exceeds a threshold voltage.

DETAILED DESCRIPTION OF EXAMPLE EMBODIMENTS

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

A variety of techniques have been applied to measure load circuit current consumption. Some applications measure current using a shunt resistor and a high-resolution analog-to-digital converter (ADC) to measure the voltage dropped across the shunt resistor. The shunt resistor and ADC can add significant cost and power consumption to the application. Some applications estimate load current consumption based on power supply switching frequency. However, such systems may fail to accurately track load power consumption due to architectural distinctions that affect the relationship of current consumption to switching frequency. Some methods require disconnection of the load from the power supply to measure load current, which reduces the quality of voltage regulation provided to the load.

The load current measurement circuits described herein provide accurate load current measurement while minimizing additional cost and power consumption. The load current measurement circuits of this description scale the peak inductor current of a DC-DC converter to produce a capacitor charging current. The capacitor charging current is a function of DC-DC converter operating mode, DC-DC converter operating frequency, and peak inductor current. Implementations of the load current measurement circuits described herein adjust capacitor charging current based on converter operating mode, operating frequency, and peak current. Time to charge the capacitor to a threshold voltage is indicative of the current consumption of the load.

Figure 1:
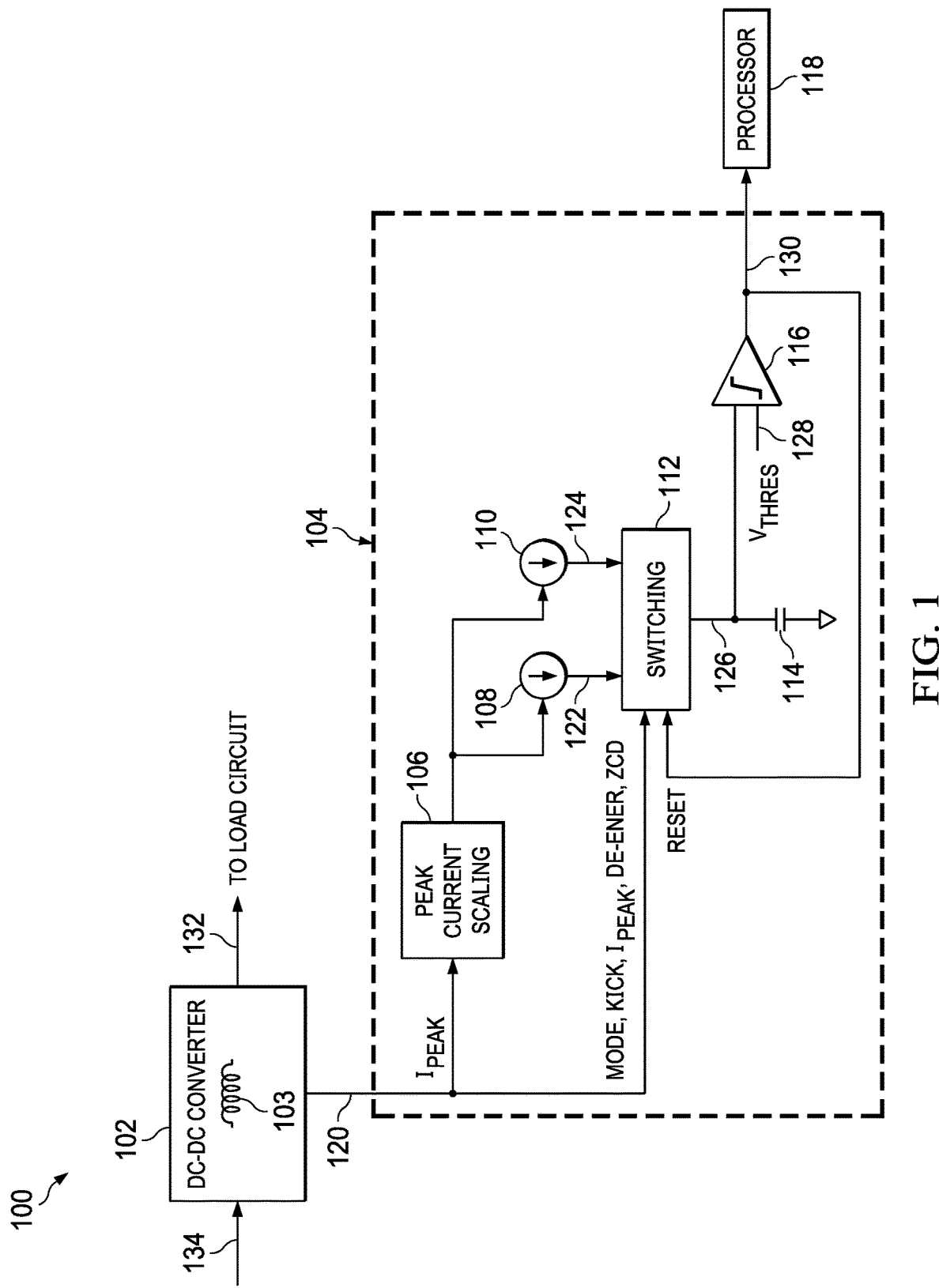
FIG. 1 shows a block diagram for an example of a switch-mode power supply that includes load current metering in accordance with this description.

FIG. 1 shows a block diagram for an example of a switch-mode power supply 100 that includes load current metering in accordance with this description. The switch-mode power supply 100 includes a DC-DC converter 102, load current metering circuitry 104, and a processor 118. The DC-DC converter 102 generates an output voltage 132 from an input voltage 134. The output voltage 132 may be higher or lower than the input voltage 134. That is, the DC-DC converter 102 may operate in buck (step-down) mode, boost (step-up) mode, and/or buck-boost (step-up-step-down) mode. The output voltage 132 generated by the DC-DC converter 102 is provided to a load circuit. The DC-DC converter 102 includes one or more switching transistor(s) and an inductor 103. The switching transistor(s) are activated to charge the inductor 103, and deactivated to discharge the inductor 103. The DC-DC converter 102 includes control circuitry that controls activation and deactivation of the switching transistor(s). For example, the control circuitry may apply feedback based on the output voltage 132 to control activation and deactivation of the switching transistor(s) to produce a desired value of the output voltage 132.

The DC-DC converter 102 generates a number of status signals 120 that are provided to the load current metering circuitry 104. The status signals 120 include an indication of the peak current flowing in the conductor. $I_{PEAK}$ can vary with semiconductor processing, temperature, and other factors. The status signals 120 also include the operational mode of the DC-DC converter 102 (e.g., buck, boost, and buck-boost), timing information that specifies the charging/discharging of the inductor 103 in the DC-DC converter 102. The timing information includes inductor 103 charging start time (KICK), peak current flow time ($I_{PEAK}$), inductor discharge start time (DE_ENER), and inductor discharge time (ZCD).

The load current metering circuitry 104 is coupled to the DC-DC converter 102. The load current metering circuitry 104 measures the current consumed by the load circuit. The load current metering circuitry 104 implements a coulomb counting approach to measure the current consumed by the load circuit based on the charge-discharge timing and peak current applied to the inductor 103 of the DC-DC converter 102. The load current metering circuitry 104 includes peak current scaling circuitry 106, a current source 108, a current source 110, switching circuitry 112, a capacitor 114, and a comparator 116. The peak current scaling circuitry 106 includes circuitry to scale-down or divide the peak current that the DC-DC converter 102 allows to flow in the inductor 103 of the DC-DC converter 102. For example, the load current metering circuitry 104 may include a current mirror that produces a current that is a predetermined fraction (e.g., ⅕₀₀₀) of the peak current allowed to flow in the inductor 103 of the DC-DC converter 102. Some implementations of the peak current scaling circuitry 106 may include other circuitry to divide the peak inductor current by a predetermined divisor. The DC-DC converter 102 provides the peak current or an indicator of the peak current to the peak current scaling circuitry 106 for division.

The current source 108 and the current source 110 are coupled to the peak current scaling circuitry 106. The current source 108 produces a first current that is one-half of the scaled peak current generated by the peak current scaling circuitry 106. The current source 110 produces a second current that is one-half of the scaled peak current generated by the peak current scaling circuitry 106. For example, each of the current source 108 and the current source 110 may include a current mirror that produces a current that one-half of the scaled peak current generated by the peak current scaling circuitry 106. The current source 108 and the current source 110 are coupled to the switching circuitry 112. The currents produced by the current source 108 and current source 110 are provided to the switching circuitry 112.

The switching circuitry 112 includes circuitry to route the current 122 generated by the current source 108 and the current 124 generated by the current source 110 to the capacitor 114. The currents routed to the capacitor 114 increase the charge stored on, and the voltage across, the capacitor 114.

The capacitor 114 is coupled to the comparator 116. The comparator 116 compares the voltage across the capacitor 114 to a threshold voltage 128. The threshold voltage 128 represents a predetermined charge on the capacitor 114, which in-turn represents a current flowing to the capacitor 114, and a current flowing to the load. The output of the comparator 116 changes state when the voltage across the capacitor 114 crosses the threshold voltage 128. For example, when the voltage across the capacitor 114 rises above or falls below the threshold voltage 128, the output of the comparator 116 changes state.

The output signal 130 of the comparator 116 is provided to the processor 118. The processor 118 determines the amount of current flowing to the load circuit based on the time between state changes on the signal 130 caused by the increase in voltage across the capacitor 114.

Figure 2:
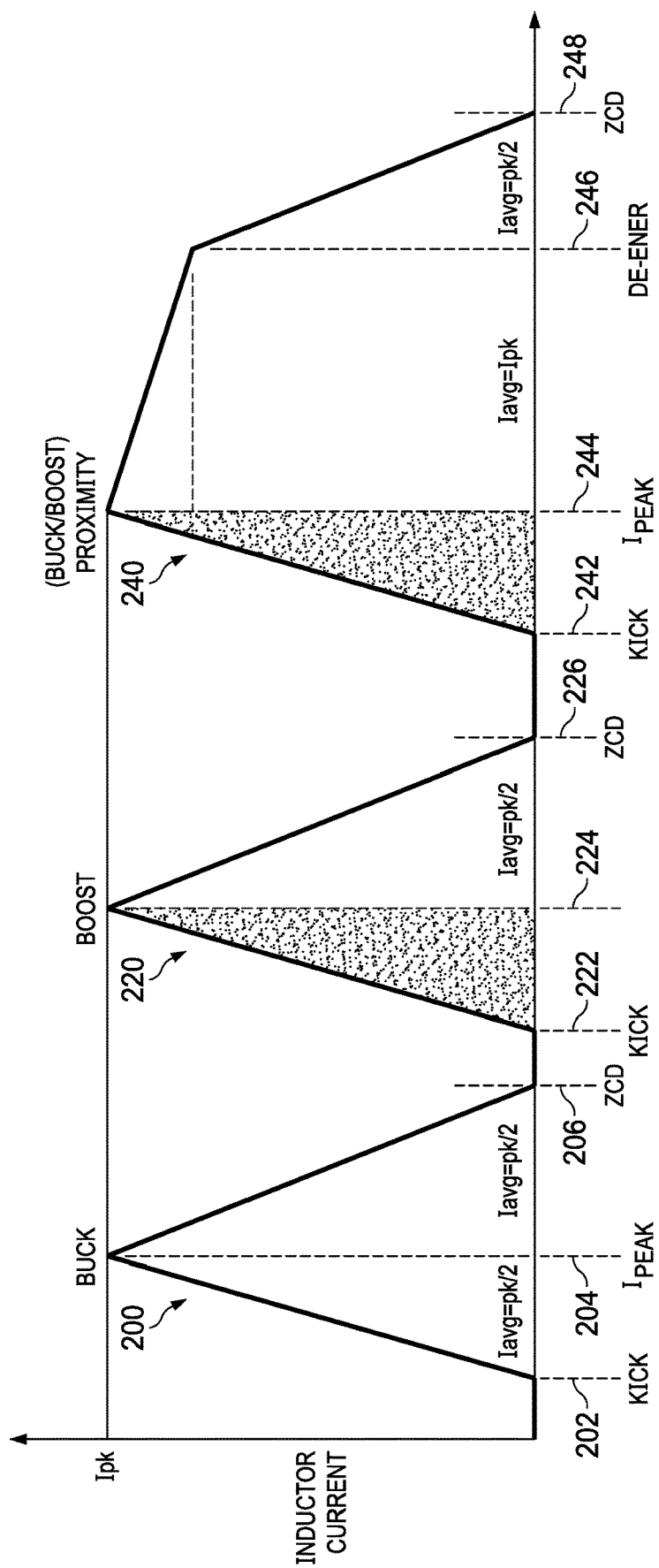
FIG. 2 shows a graph of inductor charging current applied in buck mode, boost mode, and buck-boost mode in load current metering circuitry in accordance with this description.

The current routed through the switching circuitry 112 to the capacitor 114 is a function of the mode in which the DC-DC converter 102 is operating and the timing of inductor charging and discharging in the DC-DC converter 102. FIG. 2 shows a graph of inductor charging current applied in buck mode, boost mode, and buck-boost mode in the DC-DC converter 102. When the DC-DC converter 102 is operating in the buck mode and executing a buck mode inductor charge/discharge cycle 200, inductor current increases starting at time 202 (KICK) when the DC-DC converter 102 initiates charging of the inductor 103. Current in the inductor 103 increases until the current flowing in the inductor 103 is the peak current allowed in the inductor 103 at time 204 ($I_{PEAK}$). When the peak current is flowing in the inductor 103, the DC-DC converter 102 discontinues charging of the inductor 103, and current flows from the inductor 103 until time 206 (ZCD) when the inductor 103 is discharged and zero current is flowing in the inductor 103. In the time between KICK 202 and $I_{PEAK}$ 204 the average current flowing in the inductor 103 is $I_{PEAK}/2$. Similarly, in the time between $I_{PEAK}$ 204 and ZCD 206 the average current flowing in the inductor 103 is $I_{PEAK}/2$. Correspondingly, when the DC-DC converter 102 is operating in buck mode the load current metering circuitry 104 routes one of the currents 122 or 124 to the capacitor 114 in the time between KICK 202 and ZCD 206.

When the DC-DC converter 102 is operating in the boost mode and executing a boost mode inductor charge/discharge cycle 220, starting at time 222 (KICK) the DC-DC converter 102 initiates charging of the inductor 103 until the current flowing in the inductor 103 is the peak current allowed in the inductor 103 at time 224 ($I_{PEAK}$). In the time between KICK 222 and $I_{PEAK}$ 224 no current flows from the inductor 103 to the load circuit. When the peak current is flowing in the inductor 103, the DC-DC converter 102 discontinues charging of the inductor 103, and current flows from the inductor 103 until time 226 (ZCD) when no current is flowing in the inductor 103. In the time between $I_{PEAK}$ 224 and ZCD 226 the average current flowing in the inductor 103 is $I_{PEAK}/2$. Correspondingly, when the DC-DC converter 102 is operating in boost mode, the load current metering circuitry 104 routes no current to the capacitor 114 in the time between KICK 222 and $I_{PEAK}$ 224, and the load current metering circuitry 104 routes one of the currents 122 or 124 to the capacitor 114 in the time between $I_{PEAK}$ 224 and ZCD 226.

When the DC-DC converter 102 is operating in the buck-boost mode and executing a buck-boost mode inductor charge/discharge cycle 240, starting at time 242 (KICK) the DC-DC converter 102 initiates charging of the inductor 103 until the current flowing in the inductor 103 is the peak current allowed in the DC-DC converter 102 at time 244 ($I_{PEAK}$). In the time between KICK 242 and $I_{PEAK}$ 244 no current flows from the inductor 103 to the load circuit. When the peak current is flowing in the inductor 103, the DC-DC converter 102 allows current to flow into the inductor 103 and out of the inductor 103 to the load circuit until time 246 (DE-ENER). At time DE-ENER 246, the DC-DC converter 102 discontinues charging of the inductor 103, and current flows from the inductor 103 to the load circuit until time 248 (ZCD) when no current is flowing in the inductor 103. In the time between DE-ENER 246 and ZCD 248 the average current flowing in the inductor 103 is $I_{PEAK}/2$. Correspondingly, when the DC-DC converter 102 is operating in buck-boost mode, the load current metering circuitry 104 routes no current to the capacitor 114 in the time between KICK 242 and $I_{PEAK}$ 244, the load current metering circuitry 104 routes both of the currents 122 and 124 to the capacitor 114 in the time between $I_{PEAK}$ 224 and DE-ENER 246, and the load current metering circuitry 104 routes one of the currents 122 or 124 to the capacitor 114 in the time between DE-ENER 246 and ZCD 248.

Figure 3:
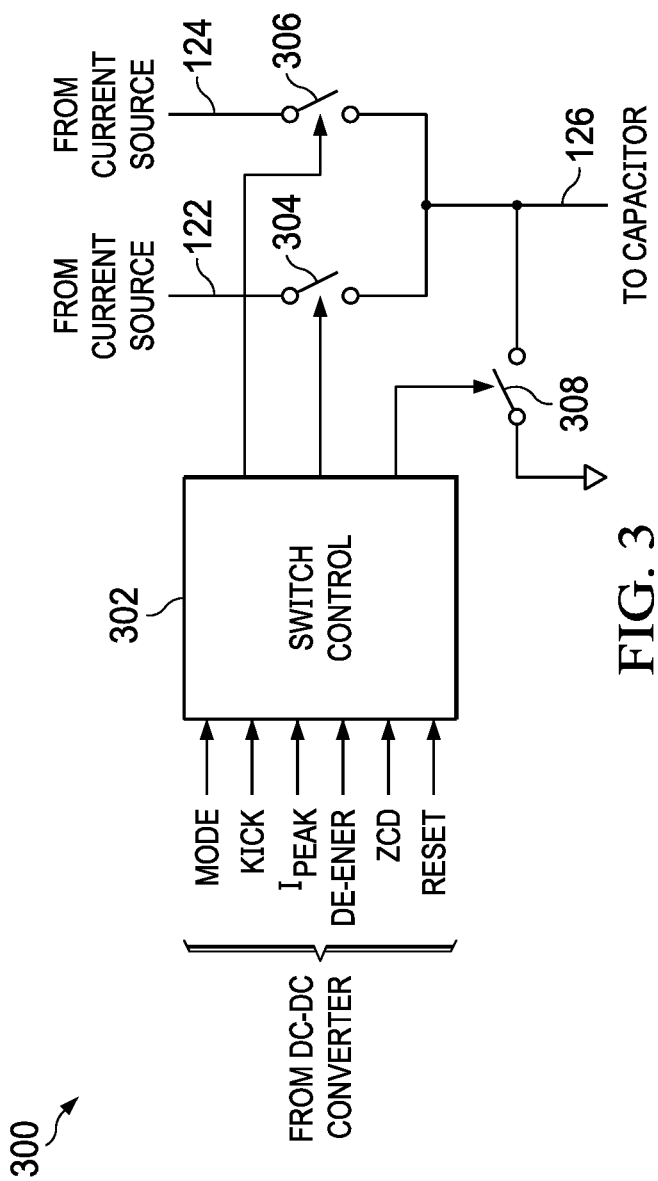
FIG. 3 shows a block diagram for an example of switching circuitry used in load current metering circuitry in accordance with this description.

FIG. 3 shows a block diagram for an example of switching circuitry 300 used in load current metering circuitry in accordance with this description. The switching circuitry 300 is an implementation of the switching circuitry 112. The switching circuitry 300 includes switch control circuitry 302, switch 304, switch 306, and switch 308. The switch 304 switchably connects the current source 108 to the capacitor 114, and the switch 306 switchably connects the current source 110 to the capacitor 114. The switch 308 switchably connects the capacitor 114 to ground to discharge the capacitor 114 and reset coulomb counting.

The switch control circuitry 302 controls the switch 304, the switch 306, and the switch 308 based on the status signals 120 provided by the DC-DC converter 102, and the output state of the comparator 116. The status signals 120 received from the DC-DC converter 102 include a MODE signal that indicates the operational mode of the DC-DC converter 102, and signals KICK, $I_{PEAK}$, DE-ENER, and ZCD that reflect the charge timing/state of the inductor 103.

When the MODE signal indicates that the DC-DC converter 102 is operating in the buck mode, the switch control circuitry 302 closes one of the switch 304 and the switch 306 and opens the other of the switch 304 and the switch 306 at activation of the signal KICK to initiate charging of the capacitor 114 by current $I_{PEAK}/2$. Prior to activation of the KICK signal, the switch 304 and the switch 306 are open. After activation of the KICK signal, the switch control circuitry 302 maintains closure of the one of the switch 304 and switch 306 until activation of the signal ZCD. At activation of the signal ZCD the switch control circuitry 302 opens the switch 304 and the switch 306 to discontinue charging of the capacitor 114.

When the MODE signal indicates that the DC-DC converter 102 is operating in the boost mode, the switch control circuitry 302 closes one of the switch 304 and the switch 306 and opens the other of the switch 304 and the switch 306 at activation of the signal $I_{PEAK}$ to initiate charging of the capacitor 114 by current $I_{PEAK}/2$, and maintains closure of the one of the switch 304 and switch 306 until activation of the signal ZCD. Prior to activation of the signal $I_{PEAK}$, the switch 304 and the switch 306 are open. At activation of the signal ZCD the switch control circuitry 302 opens the switch 304 and the switch 306 to discontinue charging of the capacitor 114.

When the MODE signal indicates that the DC-DC converter 102 is operating in the buck-boost mode, the switch control circuitry 302 closes both of the switch 304 and the switch 306 at activation of the signal $I_{PEAK}$ to initiate charging of the capacitor 114 by current $I_{PEAK}$, and maintains closure of the one of the switch 304 and switch 306 until activation of the signal DE-ENER. At activation of the signal DE-ENER, the switch control circuitry 302 maintains closure of one of the switch 304 and the switch 306 and opens the other of the switch 304 and the switch 306 to charge the capacitor 114 using current $I_{PEAK}/2$. At activation of the signal ZCD the switch control circuitry 302 opens the switch 304 and the switch 306 to discontinue charging of the capacitor 114.

When the signal RESET is activated, the switch control circuitry 302 closes the switch 308 to discharge the capacitor 114. The switch control circuitry 302 may maintain closure of the switch 308 for a predetermined time period to insure complete discharge of the capacitor 114. In some implementations, the switch control circuitry 302 may delay closure of the switch 308 for a predetermined time interval after activation of the signal RESET. In some implementations, the signal RESET is the output of the comparator 116 or is derived from the output of the comparator 116.

Figure 4:
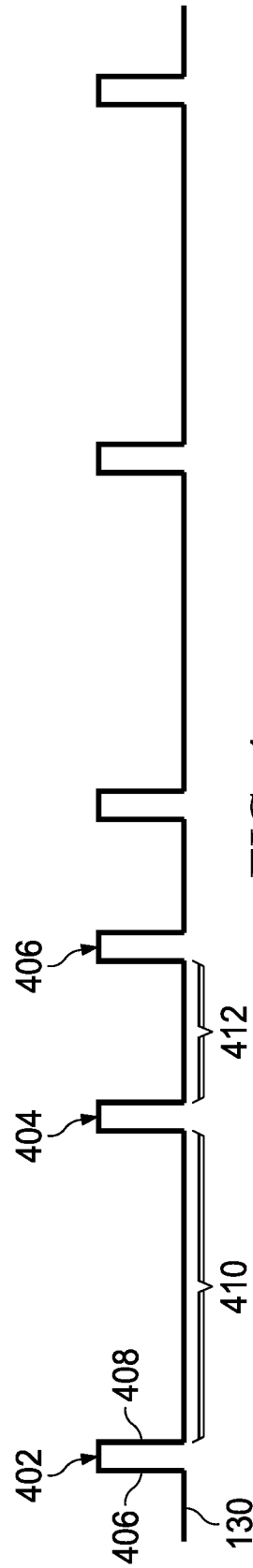
FIG. 4 shows comparator output pulses used to determine load current in load current metering circuitry in accordance with this description.

FIG. 4 shows output pulses produced by the comparator 116 and used to determine load current in the load current metering circuitry 104 in accordance with this description. The output pulses 402, 404, and 406 are produced by the comparator 116 responsive to the voltage across the capacitor 114 crossing the threshold voltage 128. For example, if the voltage across the capacitor 114 increases to exceed the threshold voltage 128, then the leading edge 406 of the output pulse 402 is generated. When the capacitor 114 is discharged, the trailing edge 408 of the output pulse 402 is generated. Each of the output pulses 402, 404, and 406 represent a predetermined amount of charge on the capacitor 114 and a corresponding amount of current flowing to the load circuit. The processor 118 receives the output pulses 402, 404, and 406 and measures the time between the pulses to determine the rate of current flow to the load circuit based on the amount of current represented by each of the pulses. For example, the time 412 between the output pulse 404 and the output pulse 406 is shorter than the time 410 between the output pulse 402 and the output pulse 404. Accordingly, the current flow in time 412 is greater than the current flow in time 410. The processor 118 may provide a measurement of the current flowing to the load circuit to circuits or systems external to the switch-mode power supply 100.

Figure 5:
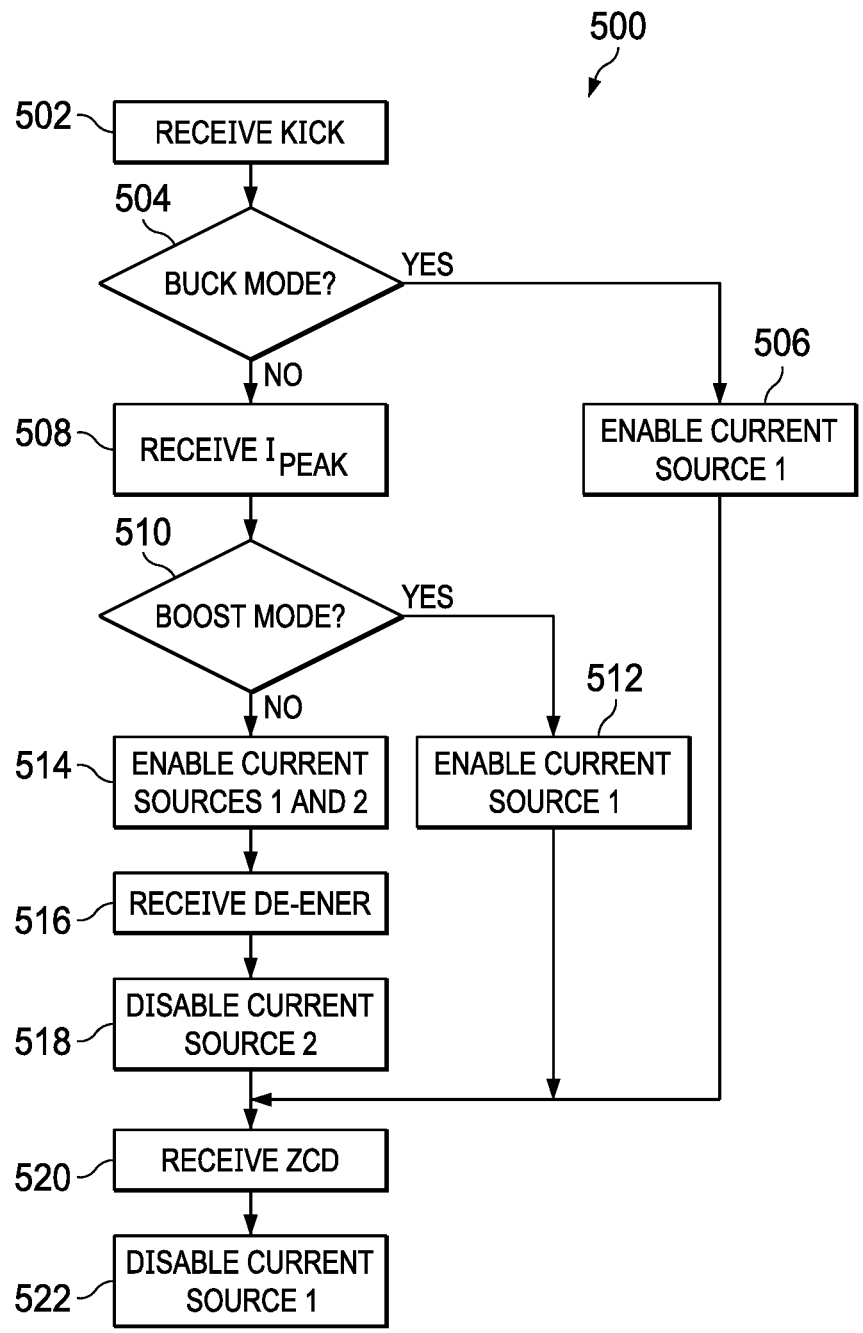
FIG. 5 shows a flow diagram for a method for switching charging current to a capacitor for measuring load current in accordance with this description.

FIG. 5 shows a flow diagram for a method 500 for switching charging current to a capacitor for measuring load current in accordance with this description. Though depicted sequentially as a matter of convenience, at least some of the actions shown can be performed in a different order and/or performed in parallel. Additionally, some implementations may perform only some of the actions shown. Operations of the method 500 may be performed by the load current metering circuitry 104.

In block 502, the DC-DC converter 102 is operating and is providing state information to the load current metering circuitry 104 for use in measuring load current. The DC-DC converter 102 initiates charging of the inductor 103 and activates the signal KICK. The switch 304 and the switch 306 are open and the capacitor 114 is not charging. The load current metering circuitry 104 receives the KICK signal.

In block 504, responsive to reception of the KICK signal, the load current metering circuitry 104 determines whether the DC-DC converter 102 is operating in buck mode. For example, the mode of the operation of the DC-DC converter 102 may be encoded in or provided by the MODE signal generated by the DC-DC converter 102.

If the DC-DC converter 102 is operating in the buck mode, then, in block 506, the load current metering circuitry 104 enables the current source 108 for charging the capacitor 114. For example, the switch control circuitry 302 may close the switch 304 to route current from the current source 108 to the capacitor 114. If the DC-DC converter 102 is not operating in the buck mode, the load current metering circuitry 104 maintains the switch 304 and the switch 306 in an open condition.

In block 508, the current flowing in the inductor 103 is at a predetermined peak value, and the DC-DC converter 102 activates the signal $I_{PEAK}$ to so indicate. The load current metering circuitry 104 receives the signal $I_{PEAK}$.

In block 510, the DC-DC converter 102 is not operating in buck mode, and the load current metering circuitry 104 determines whether the DC-DC converter 102 is operating in boost mode. For example, the mode of the operation of the DC-DC converter 102 may be encoded in or provided by the MODE signal generated by the DC-DC converter 102.

If the DC-DC converter 102 is operating in the boost mode, then, in block 512, the load current metering circuitry 104 enables the current source 108 for charging the capacitor 114. For example, the switch control circuitry 302 may close the switch 304 to route current from the current source 108 to the capacitor 114.

If the DC-DC converter 102 is not operating in the boost mode, then the DC-DC converter 102 is operating in the buck-boost mode, and in block 514, the load current metering circuitry 104 enables the current source 108 and the current source 110 for charging the capacitor 114. For example, the switch control circuitry 302 may close the switch 304 and the switch 306 to route current from the current source 108 and the current source 110 to the capacitor 114.

In block 516, the DC-DC converter 102 is operating in the buck-boost mode. The DC-DC converter 102 discontinues charging of the inductor 103, and activates the signal DE-ENER to indicate that charging of the inductor 103 has been discontinued.

In block 518, the load current metering circuitry 104 disables charging of the capacitor 114 by the current source 110. For example, the switch control circuitry 302 may open the switch 306 to prevent current flow from the current source 110 to the capacitor 114. The load current metering circuitry 104 continues to route current from the current source 108 to the capacitor 114, In block 520, the inductor 103 has been discharged, and the DC-DC converter 102 activates the signal ZCD to so indicate. The load current metering circuitry 104 receives the signal ZCD.

In block 522, the load current metering circuitry 104 discontinues charging of the capacitor 114 by disabling the flow of current from the current source 108 to the capacitor 114. For example, the switch control circuitry 302 may open the switch 304 to prevent the flow of current from the current source 108 to the capacitor 114.

In some implementations of the switch-mode power supply 100, the DC-DC converter 102 is a single-inductor multiple-output (SIMO) converter. Implementations of the load current metering circuitry 104 can be applied to measure the load current provided by the DC-DC converter 102 to each load circuit connected to the DC-DC converter 102. For example, an instance of the load current metering circuitry 104 may be provided for each output of the SIMO DC-DC converter.

Some implementations of the switch-mode power supply 100 may provide load current metering by measuring the time between the inductor charging signals KICK, $I_{PEAK}$, DE-ENER, and ZCD and inductor charge/discharge cycles, and applying a predetermined value of $I_{PEAK}$ to compute average current consumed by a load circuit. For example, referring again to FIG. 2, if the DC-DC converter 102 is operating in buck mode, then the processor 118 may measure the time between KICK 202 and ZCD 206, and the time between successive inductor charge/discharge cycles 200, and compute the average current flowing to the load circuit as a function of $I_{PEAK}$ and the measured time values. Similar measurements and computations may be applied to estimate load current if the DC-DC converter 102 is operating in boost mode or buck-boost mode.

Modifications are possible in the described embodiments, and other embodiments are possible, within the scope of the claims.

What is claimed is:

1. A switch-mode power supply, comprising:
a DC-DC converter adapted to be coupled to an inductor, the DC-DC converter having a status output configured to indicate a peak current through the inductor; and
metering circuitry comprising:
scaling circuitry having a status input and a reference output, the status input coupled to the status output, and the scaling circuitry configured to provide a reference current at the reference output, in which the reference current is a first fraction of the peak current;
a current source having a reference input and a current output, the reference input coupled to the reference output, and the current source configured to provide a fractional current at the current output, in which the fractional current is a second fraction of the reference current;
a capacitor;
switching circuitry coupled between the current output and the capacitor, the switching circuitry configured to control a flow of the fractional current from the current output to the capacitor; and
a comparator having a comparator input and a comparator output, the comparator input coupled to the capacitor, and the comparator configured to indicate at the comparator output whether a voltage at the capacitor exceeds a threshold voltage.

2. The switch-mode power supply of claim 1, wherein the current source is a first current source, the reference input is a first reference input, the current output is a first current output, the fractional current is a first fractional current, and the metering circuitry further comprises:
a second current source having a second reference input and a second current output, the second reference input coupled to the reference output, and the second current source configured to provide a second fractional current at the second current output, in which the second fractional current is the second fraction of the reference current;
the switching circuitry coupled between the second current output and the capacitor and configured to control a flow of the second fractional current from the second current output to the capacitor.

3. The switch-mode power supply of claim 2, wherein the switching circuitry is configured to enable the flow of the first fractional current to the capacitor, while disabling the flow of the second fractional current to the capacitor, responsive to the DC-DC converter operating in a buck mode or a boost mode.

4. The switch-mode power supply of claim 2, wherein the switching circuitry is configured to enable the flow of the first fractional current to the capacitor, while enabling the flow of the second fractional current to the capacitor, responsive to the DC-DC converter operating in a buck-boost mode.

5. The switch-mode power supply of claim 2, wherein the switching circuitry is configured to, responsive to the DC-DC converter operating in a buck mode:
enable the flow of the first fractional current to the capacitor for a time interval starting responsive to the DC DC converter initiating charging of the inductor and ending responsive to the inductor being discharged.

6. The switch-mode power supply of claim 2, wherein the switching circuitry is configured to, responsive to the DC-DC converter operating in a boost mode:
enable the flow of the first fractional current to the capacitor for a time interval starting responsive to the peak current flowing through the inductor and ending responsive to the inductor being discharged.

7. The switch-mode power supply of claim 2, wherein the switching circuitry is configured to, responsive to the DC-DC converter operating in a buck-boost mode:
enable the flow of the first fractional current to the capacitor, while enabling the flow of the second fractional current to the capacitor, for a time interval starting responsive to the peak current flowing through the inductor and ending responsive to the DC-DC converter discontinuing charging of the inductor; and
enable the flow of the first fractional current to the capacitor, while disabling the flow of the second fractional current to the capacitor, for a time interval starting responsive to the DC-DC converter discontinuing charging of the inductor and ending responsive to the inductor being discharged.

8. The switch-mode power supply of claim 1, wherein the DC-DC converter is adapted to be coupled through the inductor to a load circuit, and the switch-mode power supply further comprises a processor coupled to the comparator output, the processor configured to:
responsive to a time between pulses at the comparator output, determine an amount of current flowing to the load circuit.

9. The switch-mode power supply of claim 1, wherein the switching circuitry is configured to discharge the capacitor responsive to the comparator output indicating that the voltage at the capacitor exceeds the threshold voltage.

10. The switch-mode power supply of claim 1, wherein the second fraction is one-half.

11. A metering circuit, comprising:
scaling circuitry having a status input and a reference output, the status input adapted to be coupled to a DC-DC converter, and the scaling circuitry configured to provide a reference current at the reference output, in which the reference current is a first fraction of a peak current through an inductor of the DC-DC converter;
a current source having a reference input and a current output, the reference input coupled to the reference output, and the current source configured to provide a fractional current at the current output, in which the fractional current is a second fraction of the reference current;
a capacitor;
switching circuitry coupled between the current output and the capacitor, the switching circuitry configured to control a flow of the fractional current from the current output to the capacitor; and
a comparator having a comparator input and a comparator output, the comparator input coupled to the capacitor, and the comparator configured to indicate at the comparator output whether a voltage at the capacitor exceeds a threshold voltage.

12. The metering circuit of claim 11, wherein the current source is a first current source, the reference input is a first reference input, the current output is a first current output, the fractional current is a first fractional current, and the metering circuit further comprises:
a second current source having a second reference input and a second current output, the second reference input coupled to the reference output, and the second current source configured to provide a second fractional current at the second current output, in which the second fractional current is the second fraction of the reference current;
the switching circuitry coupled between the second current output and the capacitor and configured to control a flow of the second fractional current from the second current output to the capacitor.

13. The metering circuit of claim 12, wherein the switching circuitry is configured to, responsive to the DC-DC converter operating in a buck mode:
enable the flow of the first fractional current to the capacitor for a time interval starting responsive to the DC-DC converter initiating charging of the inductor and ending responsive to the inductor being discharged.

14. The metering circuit of claim 12, wherein the switching circuitry is configured to, responsive to the DC-DC converter operating in a boost mode:
enable the flow of the first fractional current to the capacitor for a time interval starting responsive to the peak current flowing through the inductor and ending responsive to the inductor being discharged.

15. The metering circuit of claim 12, wherein the switching circuitry is configured to, responsive to the DC-DC converter operating in a buck-boost mode:
enable the flow of the first fractional current to the capacitor, while enabling the flow of the second fractional current to the capacitor, for a time interval starting responsive to the peak current flowing through the inductor and ending responsive to the DC-DC converter discontinuing charging of the inductor; and
enable the flow of the first fractional current to the capacitor, while disabling the flow of the second fractional current to the capacitor, for a time interval starting responsive to the DC-DC converter discontinuing charging of the inductor and ending responsive to the inductor being discharged.

16. The metering circuit of claim 12, wherein the switching circuitry is configured to, responsive to the DC-DC converter operating in a buck-boost mode:
enable the flow of the first fractional current to the capacitor, while enabling the flow of the second fractional current to the capacitor, for a time interval starting responsive to the peak current flowing through the inductor and ending responsive to the DC-DC converter discontinuing charging of the inductor; and enable the flow of the first fractional current to the capacitor, while disabling the flow of the second fractional current to the capacitor, for a time interval starting responsive to the DC-DC converter discontinuing charging of the inductor and ending responsive to the inductor being discharged.

17. The metering circuit of claim 11, wherein the switching circuitry is configured to discharge the capacitor responsive to the comparator output indicating that the voltage at the capacitor exceeds the threshold voltage.

18. The metering circuit of claim 11, wherein the second fraction is one-half.

19. A metering circuit, comprising:
a current mirror adapted to be coupled to a DC-DC converter, the current mirror having a reference output, and the current mirror configured to provide a reference current at the reference output, in which the reference current is a first fraction of a peak current through an inductor of the DC-DC converter;
a first current source having a first reference input and a first current output, the first reference input coupled to the reference output, and the first current source configured to provide a first fractional current at the first current output, in which the first fractional current is a second fraction of the reference current;
a second current source having a second reference input and a second current output, the second reference input coupled to the reference output, and the second current source configured to provide a second fractional current at the second current output, in which the second fractional current is the second fraction of the reference current;
a capacitor;
switching circuitry coupled between the first current output and the capacitor, and coupled between the second current output and the capacitor, the switching circuitry configured to control a flow of: the first fractional current from the first current output to the capacitor; and the second fractional current from the second current output to the capacitor; and
a comparator having a comparator input and a comparator output, the comparator input coupled to the capacitor, and the comparator configured to indicate at the comparator output whether a voltage at the capacitor exceeds a threshold voltage.

20. The metering circuit of claim 19, wherein the switching circuitry is configured to, responsive to the DC-DC converter operating in a buck mode:
enable the flow of the first fractional current to the capacitor for a time interval starting responsive to the DC-DC converter initiating charging of the inductor and ending responsive to the inductor being discharged.

21. The metering circuit of claim 19, wherein the switching circuitry is configured to, responsive to the DC-DC converter operating in a boost mode:
enable the flow of the first fractional current to the capacitor for a time interval starting responsive to the peak current flowing through the inductor and ending responsive to the inductor being discharged.

22. The metering circuit of claim 19, wherein the switching circuitry is configured to discharge the capacitor responsive to the comparator output indicating that the voltage at the capacitor exceeds the threshold voltage.

23. The metering circuit of claim 19, wherein the second fraction is one-half.

* * * * *